United States Patent [19]
Ledda et al.

[11] Patent Number: 5,612,980
[45] Date of Patent: Mar. 18, 1997

[54] METHOD AND APPARATUS FOR FAST LOCK TIME

[75] Inventors: Francesco Ledda; Jeffrey W. Tsao, both of Plano, Tex.

[73] Assignee: Alcatel Network Systems, Inc., Richardson, Tex.

[21] Appl. No.: 408,313

[22] Filed: Mar. 22, 1995

[51] Int. Cl.$^6$ .................................................. H03D 3/24
[52] U.S. Cl. .................... 375/375; 327/156; 331/18
[58] Field of Search ...................... 375/376, 373, 375/375, 371; 331/17, 1 R, 1 A, 18, 25, 34; 455/183.2; 327/156, 155, 162, 163

[56] References Cited

U.S. PATENT DOCUMENTS

| | | | |
|---|---|---|---|
| 3,921,095 | 11/1975 | Chu | 331/1 A |
| 4,272,729 | 6/1981 | Riley, Jr. | 331/1 A |
| 4,418,318 | 11/1983 | Swagerty et al. | 375/376 |
| 4,498,059 | 2/1985 | Edwards et al. | 331/1 A |
| 5,168,245 | 12/1992 | Koskowich | 331/1 A |

FOREIGN PATENT DOCUMENTS

| | | | |
|---|---|---|---|
| 8912931 | 12/1989 | WIPO | H03L 7/10 |
| 9513658 | 5/1995 | WIPO | H03L 7/08 |

OTHER PUBLICATIONS

European Search Report Application No. EP 96 10 4044 dated Jun. 28, 1996 by Examiner Van den Berg, J.G.J.
1979 International Symposium on Circuits and Systems Proceedings, IEEE Catalog No. 79 CH1421-7 CAS, Jul. 17-19, 1979 Hotel Pacific Tokyo, Japan.

*Primary Examiner*—Wellington Chin
*Assistant Examiner*—Paul Loomis
*Attorney, Agent, or Firm*—Baker & Botts, L.L.P.

[57] ABSTRACT

A system and method for fast frequency locking are provided in which the phase difference between first and second synchronization signals is measured (22). The frequency difference between the two signals is then determined (24). The frequency of the second synchronization signal is then set to that of the first synchronization signal (26). Thereafter, the feedback loop of a phase-locked loop circuit is closed, with an error signal representative of the phase difference between the first and second synchronization signals being offset by an amount equal to an error signal generated when the frequency of the second synchronization signal is set to that of the first synchronization signal.

15 Claims, 1 Drawing Sheet

METHOD AND APPARATUS FOR FAST LOCK TIME

TECHNICAL FIELD OF THE INVENTION

This invention relates generally to electronic circuits, and more particularly to a method and an apparatus for fast frequency locking.

BACKGROUND OF THE INVENTION

Digital communications networks are important elements of today's telecommunications systems. For reliable high speed digital communications, synchronous digital networks are often used, such as the synchronous optical network ("SONET").

In a synchronous digital network, a synchronization signal—e.g. a clock signal—is embedded in the data communications stream. This synchronization signal is used by various network elements (such as central offices) to reliably receive and transmit the digital data being transmitted on the network. Because the synchronization signal is often noisy (due to various kinds of signal interference), elements along the digital communications network employ filtering circuits to "clean-up" the synchronization signal. Typically, these filtering circuits are phase-locked loop circuits.

In normal operation, a phase-locked loop circuit generates an output synchronization signal based on the transfer function of the phase-locked loop circuit and the input synchronization signal. In this "closed-loop" mode of operation, there is very little difference between the output synchronization signal and the input synchronization signal, and any changes in the input synchronization signal are quickly matched by the output synchronization signal. If, however, the input synchronization signal is lost (or jumps significantly), such as when a fault occurs, the "closed-loop" mode is exited, and a "holdover" mode is entered.

In the holdover mode, the phase-locked loop circuit will be controlled to continue to operate at the average frequency at which it was transmitting when the synchronization signal was lost. When the input synchronization signal is restored, for example when the fault has been corrected or when a new input synchronization signal from another line is coupled to the phase-locked loop, then the phase-locked loop will be placed back in the closed loop mode to allow it to generate an output synchronization signal based on the input synchronization signal.

The period of time from when the input synchronization signal is restored to when the output of the phase-locked loop locks on to the input synchronization signal is known as the holdover recovery time. Ideally, this holdover recovery time would be zero. Unfortunately, in existing systems, the holdover recovery time may be significant, often on the order of several minutes, for example, for a frequency step of 4.7 parts per million ("ppm") between the input and output synchronization signal at the time the input synchronization signal is restored.

During this period of holdover recovery, data transmission errors are possible, since the output synchronization signal of the phase-locked loop is not at the same frequency as the input synchronization signal, and large phase offsets can be introduced. Therefore, a need has arisen for a method and an apparatus for frequency locking that results in faster frequency locking than prior art systems.

SUMMARY OF THE INVENTION

Accordingly, a method and an apparatus for frequency locking are presented which substantially eliminate or reduce disadvantages and problems associated with prior art systems.

In particular, a method of locking an output synchronization signal's frequency onto an input synchronization signal's frequency is provided which includes determining a frequency difference between the input synchronization signal and the output synchronization signal. Based on the frequency difference, the method includes setting the frequency of the output synchronization signal to the frequency of the input synchronization signal. After setting the frequency of the output synchronization signal, the method includes generating an offset signal based on a phase difference between the input synchronization signal and the output synchronization signal. Then, an error signal related to the phase difference between the input synchronization signal and the output synchronization signal is generated. The error signal is then offset by an amount related to the offset signal, and the frequency of the output synchronization signal is adjusted based on the offset error signal.

Also provided is a circuit for locking an output synchronization signal's frequency onto an input synchronization signal's frequency which includes a phase detector operable to generate an error signal based on a phase difference between the input synchronization signal and the output synchronization signal. An oscillator is used to generate the output synchronization signal. A processor is coupled to the phase detector and to the oscillator, and initially determines a frequency difference between the input synchronization signal and the output synchronization signal based on the error signal. The processor also controls the oscillator to set the frequency of the output synchronization signal to the frequency of the input synchronization signal. Then the processor operates to generate an offset signal based on a phase difference between the input synchronization signal and the output synchronization signal. The error signal is then offset by an amount related to the offset signal, and the processor controls the oscillator to adjust the frequency of the output synchronization signal based on the offset error signal.

An important technical advantage to the present invention is the fact that an output synchronization signal is quickly locked onto the frequency of an input synchronization signal by offsetting an error signal related to the phase difference between the input and output synchronization signals. By using this offset, the frequency of the output synchronization signal is immediately locked onto that of the input synchronization signal without any overshoot or undershoot and associated settling time delays.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

Figure 1:
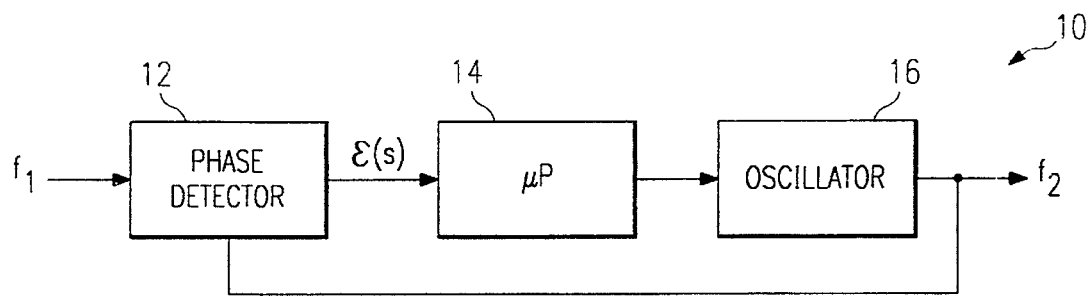
FIG. 1 illustrates a block diagram of a phase-locked loop circuit according to the teachings of the present invention.

FIG. 1 illustrates a block diagram of a phase-locked loop circuit 10 according to the teachings of the present invention. As shown in FIG. 1, an input synchronization signal $f_1$ is input to phase detector 12 of phase-locked loop 10. The output of phase detector 12 is an error signal $E(s)$ which is input to a processor 14. Processor 14 is coupled to an oscillator 16. Oscillator 16 generates an output synchronization signal $f_2$. The output synchronization signal is fed back to phase detector 12.

The advantages of the present invention may be accomplished through the use of processor 14 and its control of oscillator 16 based on the error signal $E(s)$. An important advantage of the present invention is the fact that it can be implemented on existing phase-locked loop circuits currently in use throughout digital communications networks. In particular, the general structure shown in FIG. 1 exists in phase-locked loop circuits in use today. By reprogramming the processors presently in use, the present invention can be implemented on such existing systems.

The phase detector 12 shown in FIG. 1 may be any conventional phase detector. For example, phase detector 12 may be a start/stop counter type phase/frequency detector or an analog phase/frequency detector. Similarly, the oscillator 16 may comprise most any conventional oscillator. For example, oscillator 16 may be a digitally controlled oscillator the output frequency of which is determined by digital data written to it from processor 14. As another example, oscillator 16 may be an analog voltage controlled oscillator. With an analog oscillator 16, processor 14 is used to generate the appropriate voltage to achieve the desired output oscillation frequency. In such a case, for example, processor 14 can be coupled to a digital-to-analog converter for the generation of the control voltage for the oscillator 16.

Figure 2:
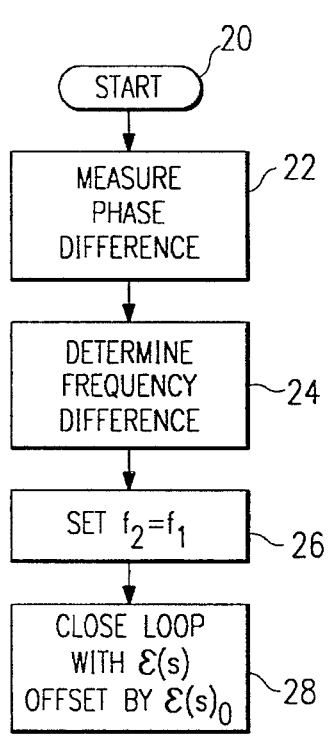
FIG. 2 illustrates flow diagram of a method of operating a phase-locked loop circuit according to the teachings of the present invention.

FIG. 2 illustrates a control sequence for controlling the phase-locked loop of FIG. 1 according to the teachings of the present invention. The method illustrated in FIG. 2 is used to recover from a holdover period, and thus is entered once the input synchronization signal $f_1$ has been restored. Thus, as shown in FIG. 2, at step 20, the method begins once $f_1$ has been restored. At step 22, the phase difference is measured between $f_1$ and $f_2$. This is accomplished with phase detector 12 and processor 14 of FIG. 1. This phase difference is represented by the error signal $E(s)$. Processor 14 then, for example through a differentiation routine, determines the frequency difference between $f_2$ and $f_1$ at step 24. In a particular embodiment, the frequency difference which is measured at step 24 may be accomplished by measuring the slope activity of the phase detector. The readings from the phase detector are averaged for a long enough time to filter out any high frequency components present in the synchronization signal $f_1$, and to achieve the level of accuracy required by the application.

Next, at step 26, processor 14 sets the frequency of $f_2$ to the frequency of $f_1$. Processor 14 can set the frequency of synchronization signal $f_1$ to equal that of synchronization signal $f_1$ immediately, or it can ramp the frequency of $f_2$ toward that of $f_1$. With the present invention, any desired ramp rate (whether linear or non-linear) can be used, including an immediate step, if desired.

At step 28, the closed loop mode is entered, but processor 14 offsets the error signal $E(s)$ by an amount equal to $E(s)_0$, which is the phase difference measured at step 22. By using the offset $E(s)_0$, the frequency of synchronization signal $f_2$ will immediately lock on to the frequency of synchronization signal $f_1$.

The offset $E(s)_0$ can be implemented within processor 14 by instructions that offset the error signal $E(s)$ by $E(s)_0$. Alternatively, the offset can be loaded onto phase detector 12 to allow phase detector 12 to perform the offset correction itself. It should be understood that the signal received at processor 14 from phase detector 12 is representative of phase, and processor 14 can actually generate the error signal $E(s)$.

Figure 3:
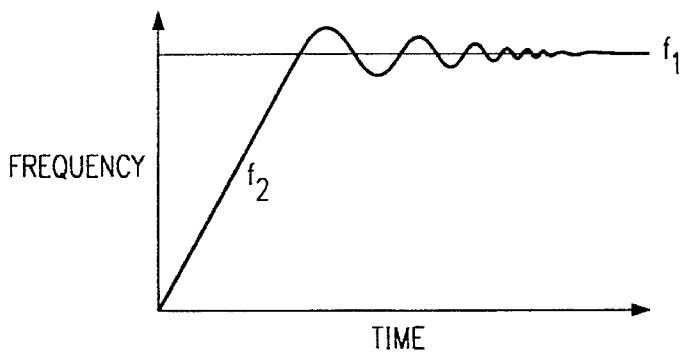
FIGS. 3 and 4 illustrate graphs of the time required to achieve a particular frequency.
Figure 4:
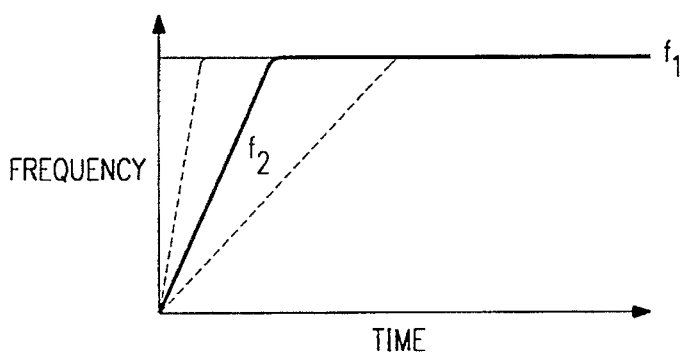

The advantages of the method and apparatus described in FIGS. 1 and 2 is illustrated graphically in FIGS. 3 and 4. FIG. 3 illustrates a frequency versus time graph of signals $f_1$ and $f_2$ with existing phase-locked loops. As shown in FIG. 3, synchronization signal $f_2$ reaches the desired frequency of signal $f_1$ only after several overshoots and undershoots. The particular graph shown in FIG. 3 is exemplary only, and different phase-locked loop circuits may have significantly more or less undershoot and overshoot than that shown in FIG. 3.

As shown in FIG. 4, once processor 14 sets the frequency of signal $f_2$ to that of $f_1$, there is no overshoot or undershoot errors in the frequency of signal $f_2$, because of the use of the error correction offset $E(s)_0$. As shown in FIG. 4, and as discussed above, the frequency of synchronization signal $f_2$ can be stepped or ramped to that of synchronization signal $f_1$ at various rates. These are illustrated by the dashed lines shown in FIG. 4.

For reliable operation in synchronous digital networks, it is only important that the frequency of synchronization signal $f_2$ be equal to that of synchronization signal $f_1$. Phase differences between the two signals, when they are at the same frequency, are not important. However, with existing phase-locked loops, phase differences between the signals $f_2$ and $f_1$ are used to adjust the frequency of $f_2$ to that of $f_1$. In particular, the feedback loop results in detection of phase differences which are then used to adjust the frequency of $f_2$. The result of this conventional control scheme is shown graphically in FIG. 3. As stated, however, it is not essential for reliable data communications that the phase of synchronization signal $f_2$ be equal to that of synchronization signal $f_1$, only that their frequencies be equal. Therefore, the present invention takes advantage of this fact and uses an offset signal $E(s)_0$. Thus, with the present invention, synchronization signal $f_2$ may have a phase shift with respect to synchronization signal $f_1$, but will have the same frequency.

By using the offset signal $E(s)_0$, upon entering the closed loop mode, the offset error signal $(E(s)-E(s)_0)$ will be zero. The offset error signal will take on non-zero values only as $f_1$ changes, and thus $f_2$ will track $f_1$ accordingly. In this manner, $f_2$ is locked onto the frequency of $f_1$ much quicker than prior art systems. For example, for a 4.7 ppm offset, a second order type 2 phase-locked loop algorithm may result in a 600 second delay in achieving a frequency lock. With the present invention, frequency lock can easily be accomplished in less than a tenth of that time with a phase-locked loop having the same closed loop bandwidth.

Figure 5:
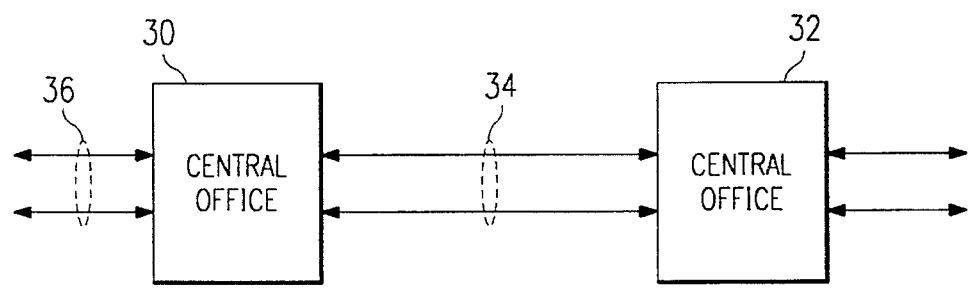
FIG. 5 illustrates a block diagram of a synchronous digital communications network.

FIG. 5 illustrates a block diagram of a synchronous digital communications network. As shown in FIG. 5, network elements 30 and 32 (which may be central offices) are coupled by a digital link 34. Link 34 may be one or more physical links. In particular, link 34 may be a fiber optic cable used as part of a SONET telecommunications network. Network elements 30 and 32, as shown in FIG. 5 may be coupled to other network elements through other communications links. The circuitry and methods described above in connection with FIGS. 1–4 are implemented in circuitry within the network elements 30 and 32. As an example, network element 30 may receive synchronization signal $f_1$ along link 34, and then generate synchronization signal $f_2$ for transmission to another network element through link 36. This example is illustrative only, and many other situations arise for the use of the circuitry and methods described above.

In summary, a method and an apparatus for assuring fast frequency locking of synchronization signals are provided in which the frequency difference between an output synchronization signal and an input synchronization signal is determined. The frequency of the second synchronization signal is then set to that of the first synchronization signal. Thereafter, an error signal representative of phase differences is offset by an error signal generated at the time that the frequency of $f_2$ is set to that of $f_1$.

Although the present invention has been described in detail, it should be understood that various modifications, alterations, substitutions, and changes can be made without departing from the intended scope as defined by the appended claims.

What is claimed is:

1. A method of locking an output synchronization signal's frequency onto an input synchronization signal's frequency, comprising:

determining a frequency difference between the input synchronization signal and the output synchronization signal;

based on the frequency difference, setting the frequency of the output synchronization signal to the frequency of the input synchronization signal;

after setting the frequency of the output synchronization signal, generating an offset signal based on a phase difference between the input synchronization signal and the output synchronization signal; then generating an error signal related to the phase difference between the input synchronization signal and the output synchronization signal;

offsetting the error signal by an amount related to the offset signal; and adjusting the frequency of the output synchronization signal based on the offset error signal to lock the output synchronization signal frequency onto the input synchronization signal frequency.

2. The method of claim 1, wherein determining the frequency difference comprises differentiating, with respect to time, a phase difference between the input synchronization signal and the output synchronization signal.

3. The method of claim 1, wherein setting the frequency of the output synchronization signal comprises ramping the frequency of the output synchronization signal to the frequency of the input synchronization signal.

4. The method of claim 1, wherein setting the frequency of the output synchronization signal comprises stepping the frequency of the output synchronization signal to the frequency of the input synchronization signal.

5. A method of locking an output synchronization signal's frequency onto an input synchronization signal's frequency, comprising:

determining the frequency of the input synchronization signal;

setting the frequency of the output synchronization signal to the frequency of the input synchronization signal;

after setting the frequency of the output synchronization signal, generating an offset signal based on a phase difference between the input synchronization signal and the output synchronization signal; then generating an error signal related to the phase difference between the input synchronization signal and the output synchronization signal;

offsetting the error signal by an amount related to the offset signal; and adjusting the frequency of the output synchronization signal based on the offset error signal to lock the output synchronization signal frequency onto the input synchronization signal frequency.

6. The method of claim 5, wherein determining the frequency difference comprises differentiating, with respect to time, a phase difference between the input synchronization signal and the output synchronization signal.

7. The method of claim 5, wherein setting the frequency of the output synchronization signal comprises ramping the frequency of the output synchronization signal to the frequency of the input synchronization signal.

8. The method of claim 5, wherein setting the frequency of the output synchronization signal comprises stepping the frequency of the output synchronization signal to the frequency of the input synchronization signal.

9. A circuit for locking an output synchronization signal's frequency onto an input synchronization signal's frequency, comprising:

a phase detector operable to generate an error signal based on a phase difference between the input synchronization signal and the output synchronization signal;

an oscillator operable to generate the output synchronization signal;

a processor coupled to the phase detector and the oscillator, the processor operable to initially determine a frequency difference between the input synchronization signal and the output synchronization signal based on the error signal and to control the oscillator to set the frequency of the output synchronization signal to the frequency of the input synchronization signal, the processor then operating to generate an offset signal based on a phase difference between the input synchronization signal and the output synchronization signal, the processor then operating to offset the error signal by an amount related to the offset signal and to control the oscillator to adjust the frequency of the output synchronization signal based on the offset error signal to lock the output synchronization signal frequency onto the input synchronization signal frequency.

10. The circuit of claim 9, wherein the processor determines the frequency difference by differentiating, with respect to time, a phase difference between the input synchronization signal and the output synchronization signal.

11. The circuit of claim 9, wherein the processor controls the oscillator to ramp the frequency of the output synchronization signal to the frequency of the input synchronization signal.

12. The circuit of claim 9, wherein the processor controls the oscillator to step the frequency of the output synchronization signal to the frequency of the input synchronization signal.

13. The circuit of claim 9, wherein the oscillator has a substantially linear transfer function.

14. The circuit of claim 9, wherein the oscillator has a nonlinear transfer function.

15. The circuit of claim 9, wherein the phase detector is a start/stop counter.

\* \* \* \* \*